US012641945B2

(12) United States Patent
Kida et al.

(10) Patent No.: US 12,641,945 B2
(45) Date of Patent: May 26, 2026

(54) DISPLAY DEVICE WITH IMPROVED APERTURE RATIO AND METHOD OF MANUFACTURING THE SAME

(71) Applicant: SHARP KABUSHIKI KAISHA, Sakai City (JP)

(72) Inventors: Sentaro Kida, Sakai City (JP); Yasushi Asaoka, Sakai City (JP); Tsuyoshi Kamada, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 545 days.

(21) Appl. No.: 18/029,896

(22) PCT Filed: Oct. 5, 2021

(86) PCT No.: PCT/JP2021/036789
§ 371 (c)(1),
(2) Date: Mar. 31, 2023

(87) PCT Pub. No.: WO2022/075309
PCT Pub. Date: Apr. 14, 2022

(65) Prior Publication Data
US 2023/0371343 A1    Nov. 16, 2023

(30) Foreign Application Priority Data

Oct. 5, 2020    (WO) .................. PCT/JP2020/037738

(51) Int. Cl.
| | |
|---|---|
| *H10K 50/115* | (2023.01) |
| *H10K 59/12* | (2023.01) |
| *H10K 59/35* | (2023.01) |
| *H10K 59/80* | (2023.01) |

(52) U.S. Cl.
CPC ....... *H10K 50/115* (2023.02); *H10K 59/1201* (2023.02); *H10K 59/35* (2023.02); *H10K 59/80515* (2023.02)

(58) Field of Classification Search
CPC ... H10K 50/115; H10K 59/1201; H10K 59/35
USPC ......................................................... 257/40
See application file for complete search history.

(56) References Cited

U.S. PATENT DOCUMENTS

| | | | |
|---|---|---|---|
| 2011/0101398 A1 | 5/2011 | Uchida | |
| 2017/0012087 A1* | 1/2017 | Seo .................... | H10K 59/1213 |
| 2017/0186832 A1* | 6/2017 | Zhang .................. | H10D 86/021 |

(Continued)

FOREIGN PATENT DOCUMENTS

| | | |
|---|---|---|
| JP | 2006269326 A | 10/2006 |
| JP | 2008288171 A | 11/2008 |
| JP | 2013058323 A | 3/2013 |

(Continued)

*Primary Examiner* — Xia L Cross
(74) *Attorney, Agent, or Firm* — ScienBiziP, P.C.

(57) ABSTRACT

A display device includes a substrate, an insulating film formed over the substrate, a first pixel electrode formed over the insulating film, a first light-emitting layer formed over the first pixel electrode and overlapping the first pixel electrode in a plan view, a second light-emitting layer formed in a recess provided in the insulating film, and a second pixel electrode overlapping the recess in a plan view. At least one of the first light-emitting layer and the second light-emitting layer includes a quantum dot as a light-emitting material.

20 Claims, 13 Drawing Sheets

(56)                        References Cited

U.S. PATENT DOCUMENTS

2018/0061905  A1      3/2018  Choi et al.

FOREIGN PATENT DOCUMENTS

| | | |
|---|---|---|
| JP | 2014075366  A | 4/2014 |
| JP | 2017120376  A | 7/2017 |

* cited by examiner (a)

(b)

1

DISPLAY DEVICE WITH IMPROVED APERTURE RATIO AND METHOD OF MANUFACTURING THE SAME

TECHNICAL FIELD

The disclosure relates to display devices.

BACKGROUND ART

Patent Literature 1 discloses a configuration where light-emitting layers that correspond to the respective three primary colors are formed in a region surrounded by partition walls (banks).

CITATION LIST

Patent Literature

Patent Literature 1: Japanese Unexamined Patent Application Publication No. 2014-75366

SUMMARY

Technical Problem

The foregoing known configuration, which requires three banks for the light-emitting layers of the three colors, unfortunately lowers the aperture ratio of a display unit (the area ratio of a light emission region to the area of the display unit).

Solution to Problem

A display device according to one aspect of the disclosure includes the following: a substrate; an insulating film formed on the substrate and having a recess; a first pixel electrode formed on the upper surface of the insulating film; a first light-emitting layer formed over the first pixel electrode and overlapping the first pixel electrode in a plan view; and a second light-emitting layer formed in the recess.

In the aspect of the disclosure, the first pixel electrode is formed on the upper surface of the insulating film, and the first light-emitting layer overlapping the first pixel electrode in a plan view is formed over the first pixel electrode; thus, the aspect can increase the aperture ratio of the display unit further than a known configuration.

2

Figure 9:
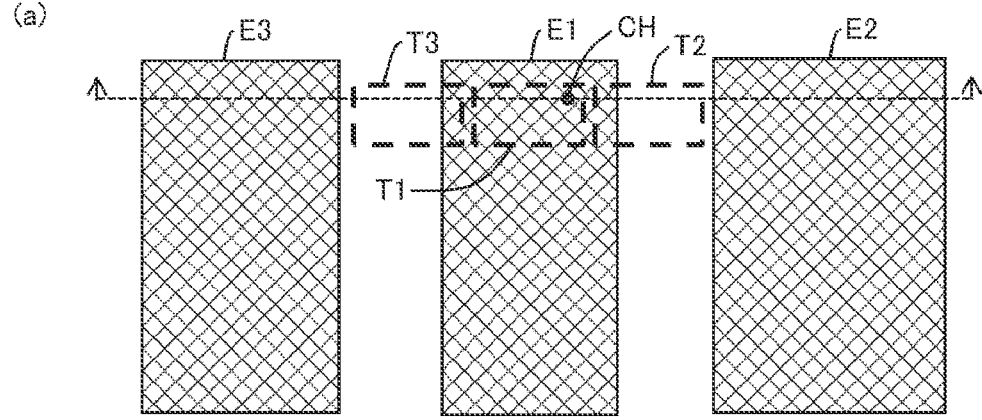
Figure 9:
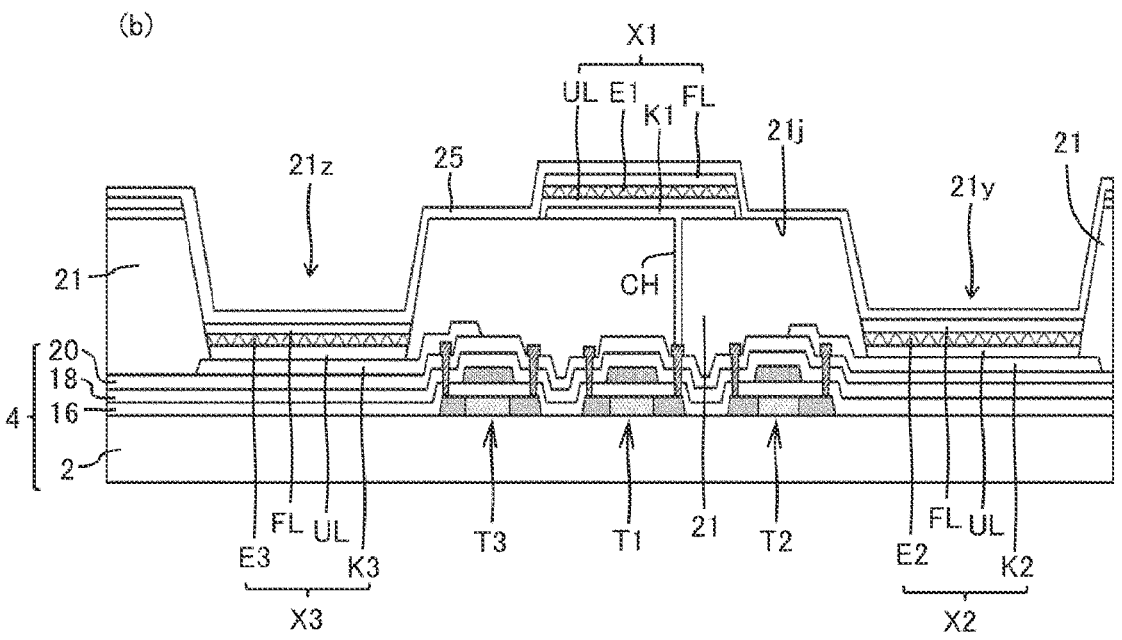

FIG. 9(*a*) is a plan view of the configuration of a display unit according to a fourth embodiment, and FIG. 9(*b*) is a sectional view of the configuration of the display unit according to the fourth embodiment.

Figure 10:
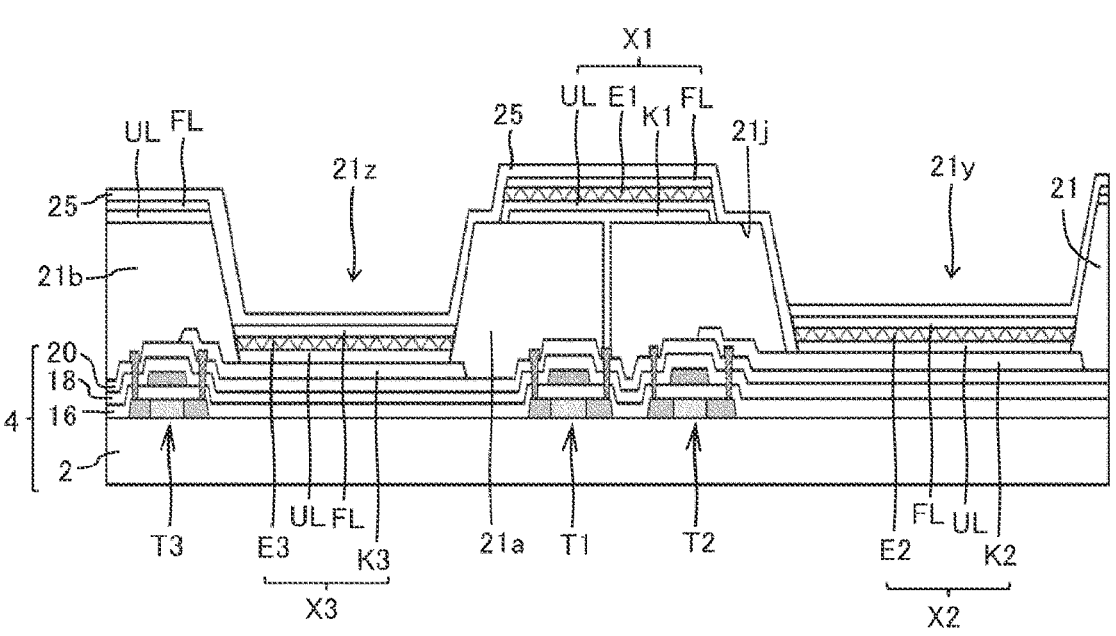

FIG. 10 is a sectional view of a modification of the display unit according to the fourth embodiment.

Figure 11:
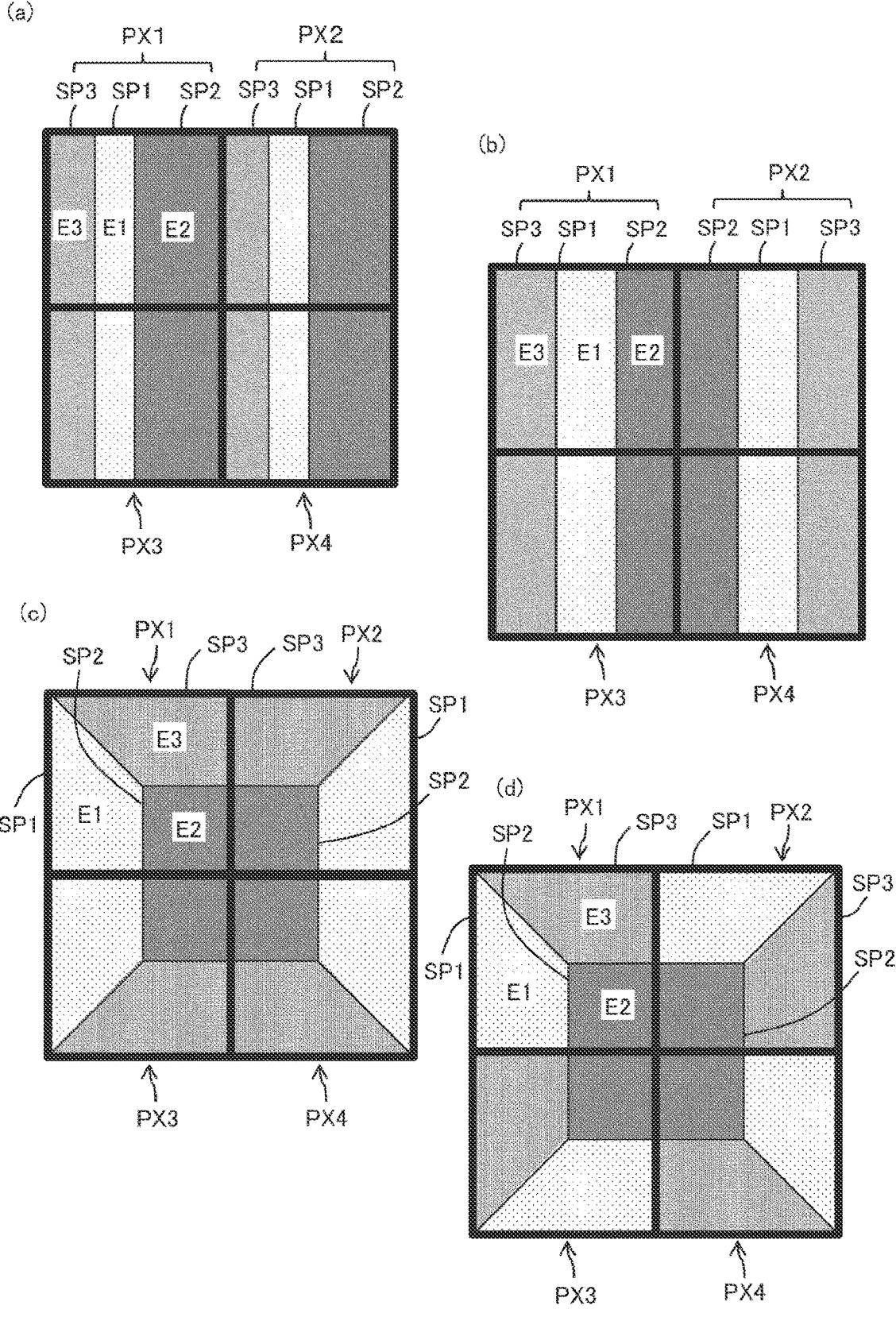

FIG. 11 is a plan view of an example pixel configuration in a corresponding one of the embodiments.

Figure 12:
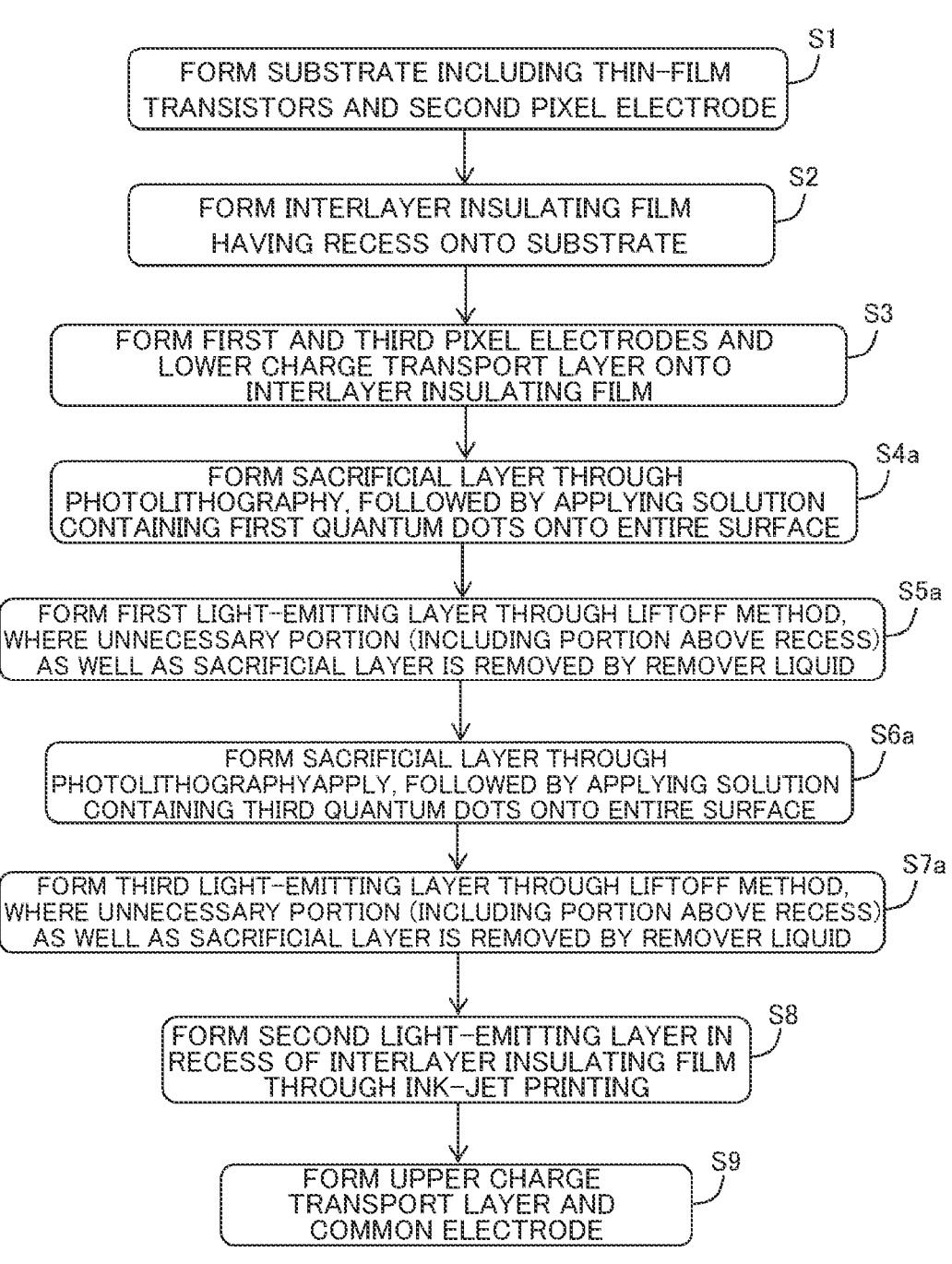

FIG. 12 is a flowchart showing an example method for manufacturing the display device.

Figure 13:
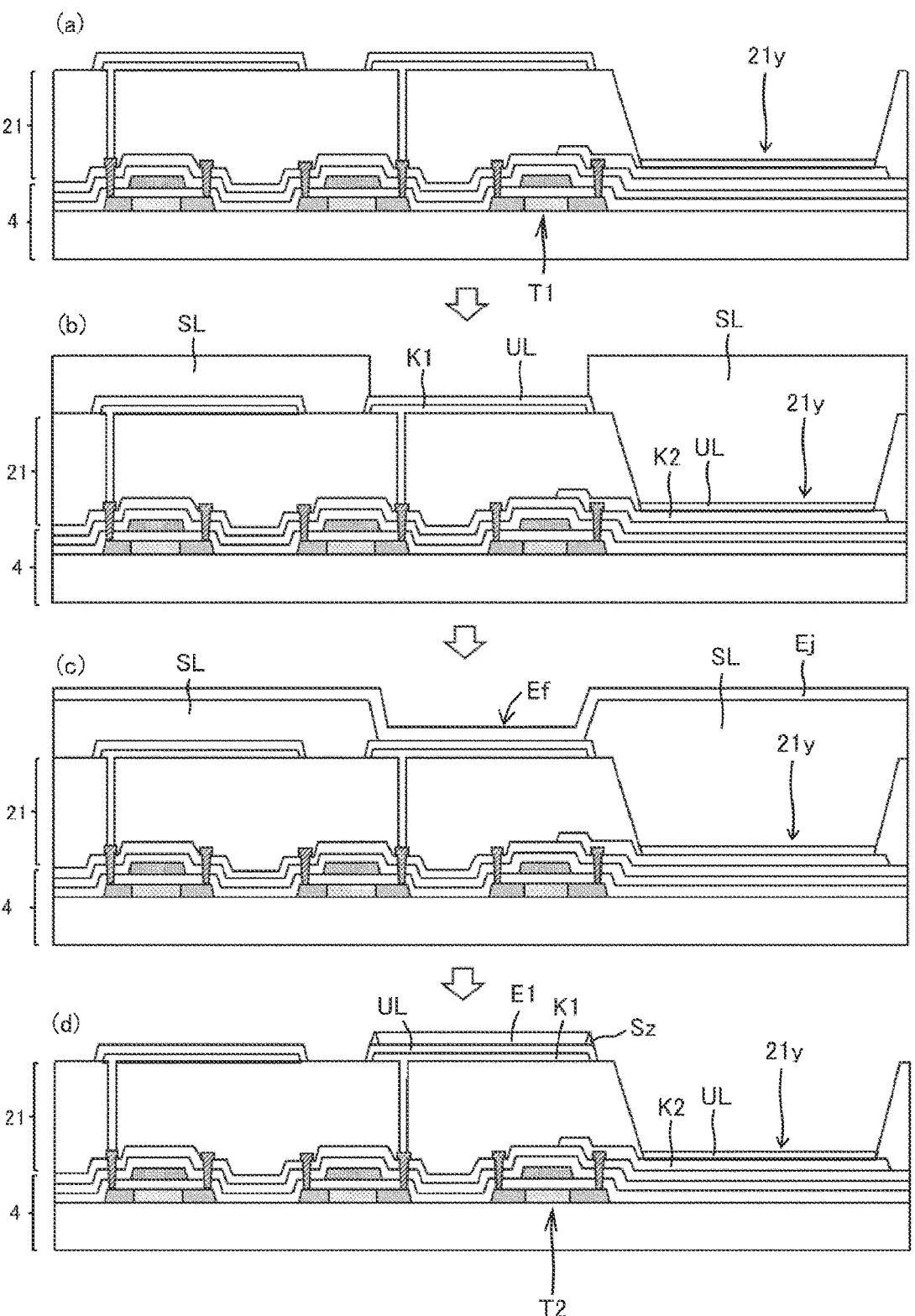

FIG. 13 illustrates, in sectional view, the method for manufacturing the display device illustrated in FIG. 12.

Figure 14:
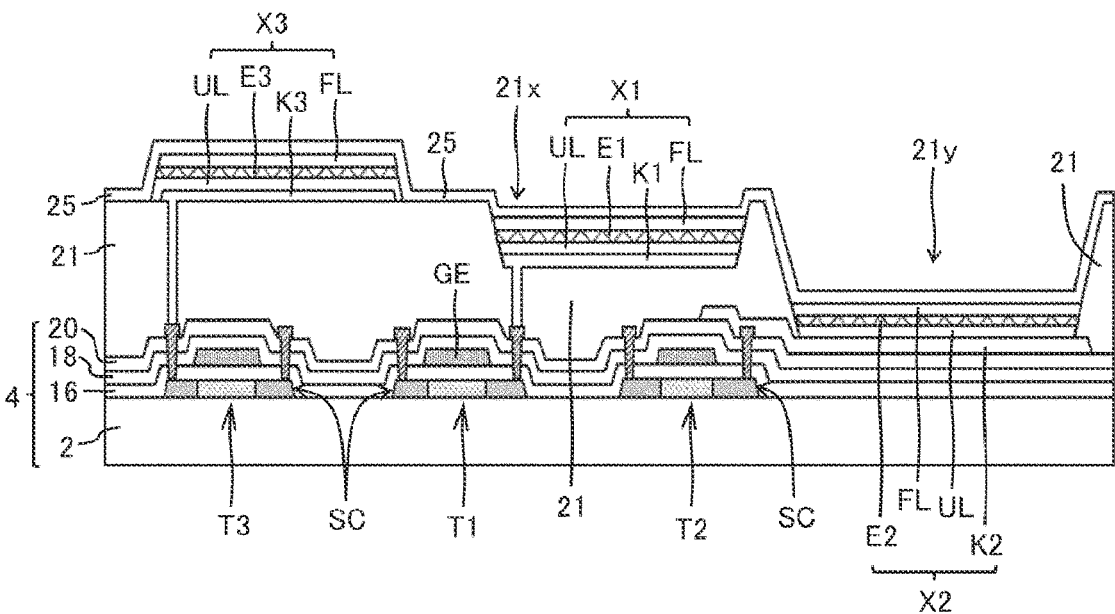

FIG. 14 is a sectional view of the configuration of a display unit according to a sixth embodiment.

Figure 15:
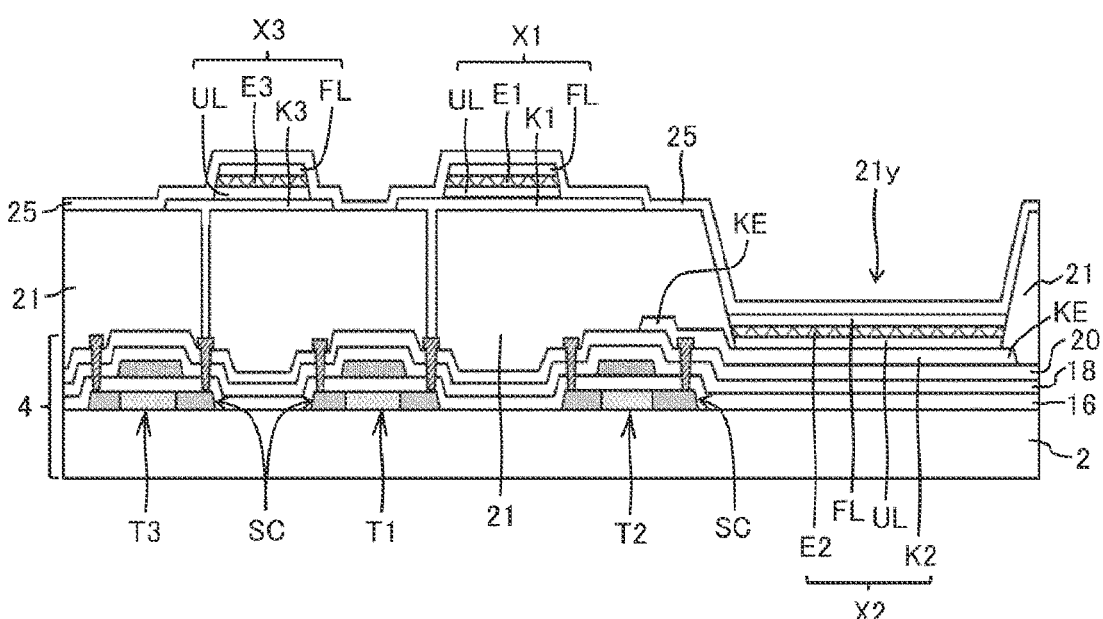

FIG. 15 is a sectional view of the configuration of a display unit according to a seventh embodiment.

Figure 16:
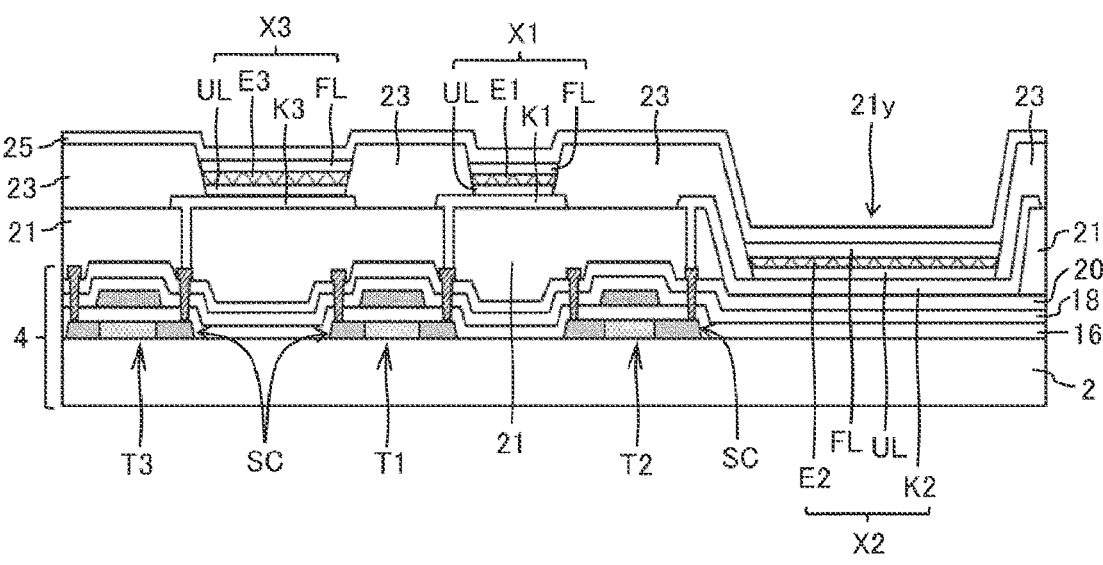

FIG. 16 is a sectional view of the configuration of a display unit according to an eighth embodiment.

Figure 17:
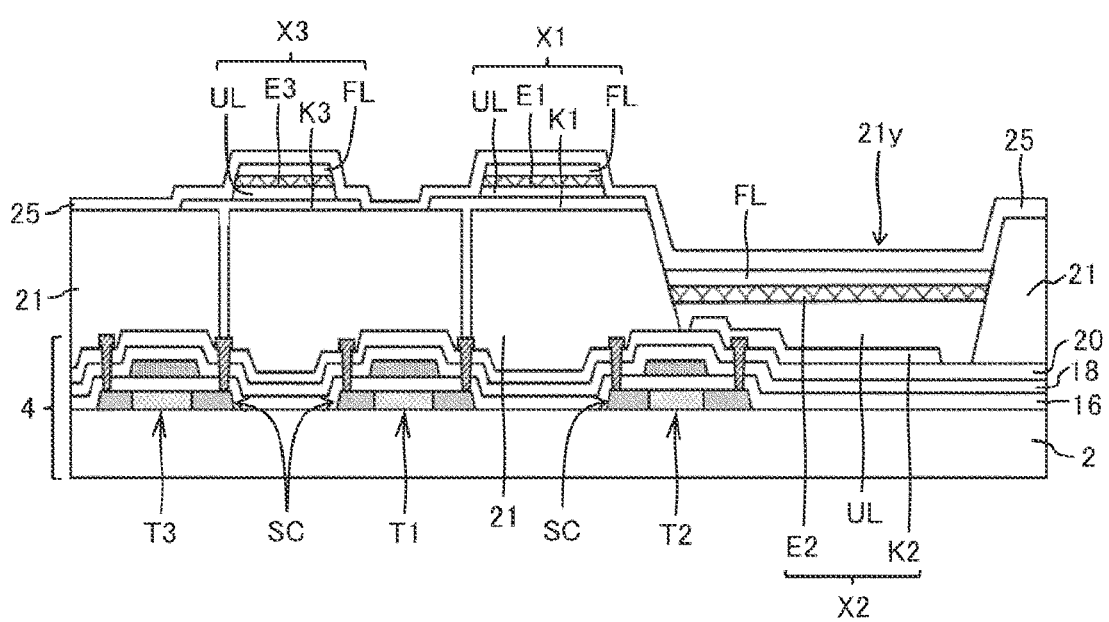

FIG. 17 is a sectional view of the configuration of a display unit according to a ninth embodiment.

DESCRIPTION OF EMBODIMENTS

Figure 1:
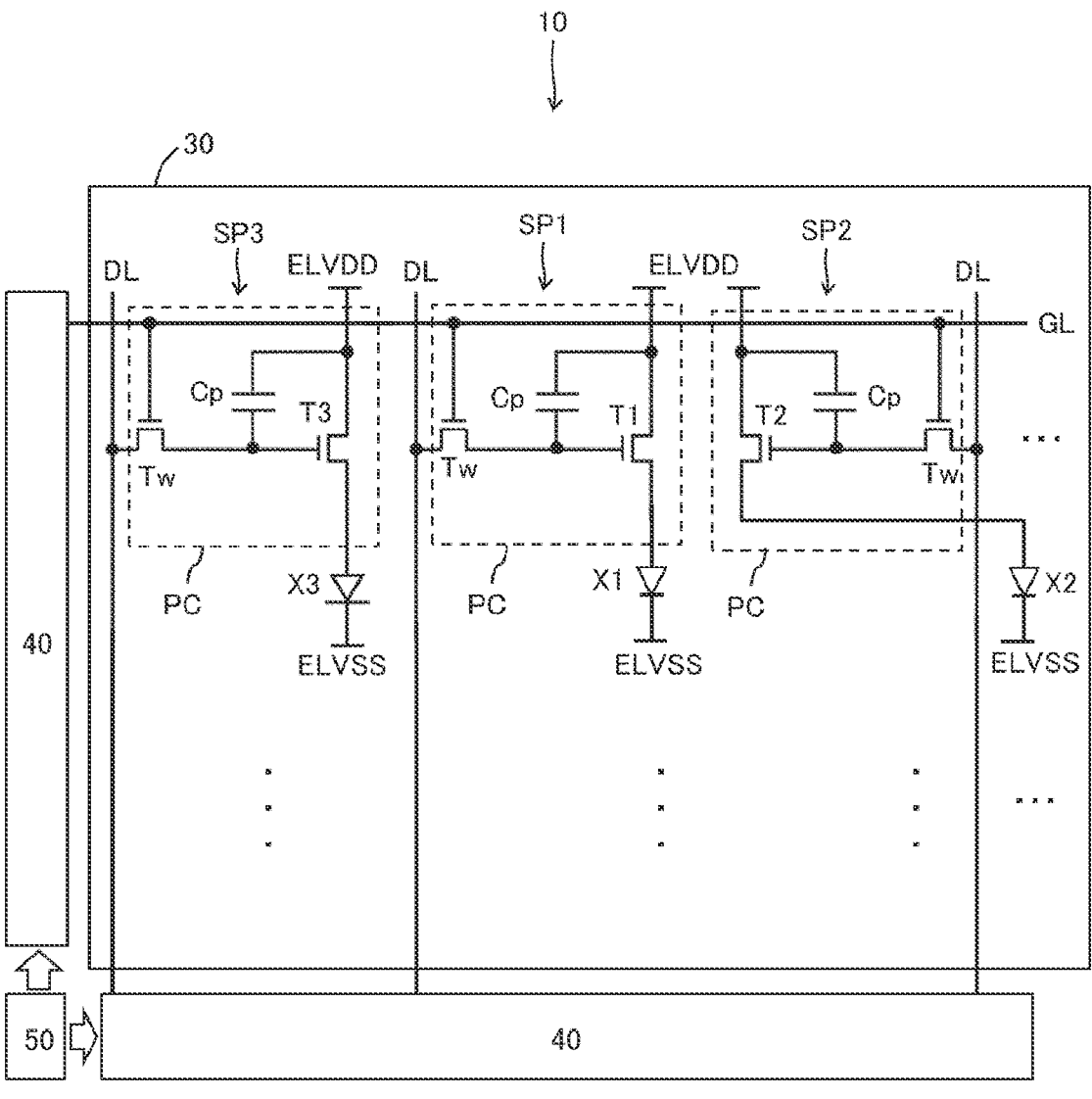
FIG. 1 is a schematic diagram of the configuration of a display device according to the embodiments.
Figure 2:
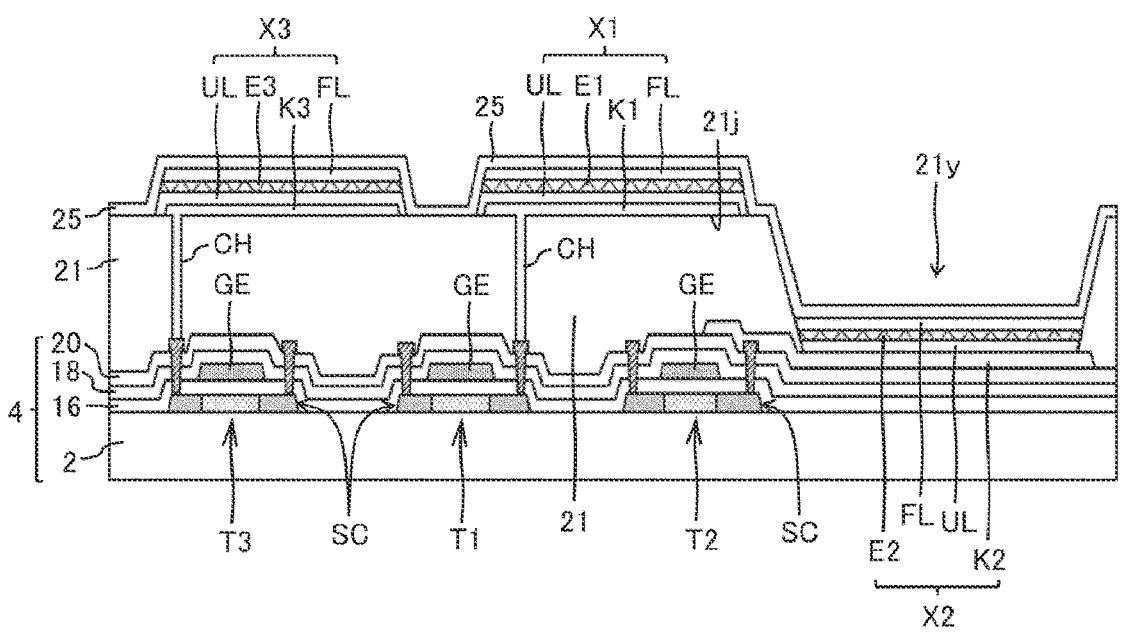
FIG. 2 is a sectional view of the configuration of a display unit according to a first embodiment.

FIG. 1 is a schematic diagram of the configuration of a display device according to the embodiments. FIG. 2 is a sectional view of the configuration of a display unit according to a first embodiment. As illustrated in FIG. 1, a display device 10 includes a display unit 30, a drive unit (driver circuit) 40 that drives the display unit 30, and a control unit 50 that controls the drive unit 40. The display unit 30 is provided with the following: a subpixel SP1 including a light-emitting element X1 and a pixel circuit PC; a subpixel SP2 including a light-emitting element X2 and a pixel circuit PC; and a subpixel SP3 including a light-emitting element X3 and a pixel circuit PC.

First Embodiment

As illustrated in FIG. 2, the display unit 30 includes an insulating film 21 and the light-emitting elements X1 to X3 formed on a substrate (TFT substrate) 4 including first to third transistors T1 to T3. The insulating film 21 is a flattening film or an interlayer insulating film for instance, and when being an interlayer insulating film, the insulating film 21 can be made of an organic material that can be applied, such as polyimide or acrylic resin. Further, when being a flattening film, the insulating film 21 can be made of, but not limited to, polyimide, acrylic resin or siloxane resin. It is noted that the insulating film 21 may be an inorganic insulating film, such as a $SiN_x$ film or a $SiO_x$ film. The insulating film 21 is provided with a recess 21*y*. The insulating film 21 is removed in the recess 21*y*.

The light-emitting element X1 includes the following: a first pixel electrode K1 formed on an upper surface 21*j* of the insulating film 21; and a first light-emitting layer E1 formed over the first pixel electrode K1 and overlapping the first pixel electrode K1 in plan view. The first pixel electrode K1 is connected to the first transistor T1 via a contact hole CH.

The light-emitting element X2 includes the following: a second pixel electrode K2 formed under the insulating film 21; and a second light-emitting layer E2 formed in the recess 21*y* of the insulating film 21 and overlapping the second pixel electrode K2 in plan view. The insulating film 21 covers the edge of the second pixel electrode K2, and the second pixel electrode K2 is connected to the second transistor T2.

The light-emitting element X3 includes the following: a third pixel electrode K3 formed on the upper surface 21*j* of the insulating film 21; and a third light-emitting layer E3 formed over the third pixel electrode K3 and overlapping the third pixel electrode K3 in plan view. The third pixel electrode K3 is connected to the third transistor T3 via a contact hole CH.

A lower charge function layer UL is provided between the first pixel electrode K1 and the first light-emitting layer E1, and an upper charge function layer FL and a common electrode 25, which is common throughout the light-emitting elements X1 to X3, are provided in this order on the first light-emitting layer E1. The lower charge function layer UL is provided between the second pixel electrode K2 and the second light-emitting layer E2, and the upper charge function layer FL and the common electrode 25, which is common, are provided in this order on the second light-emitting layer E2. The lower charge function layer UL is provided between the third pixel electrode K3 and the third light-emitting layer E3, and the upper charge function layer FL and the common electrode 25 are provided in this order on the third light-emitting layer E3.

When the light-emitting elements X1 to X3 fall under a top-emission type, the first to third pixel electrodes K1 to K3 are light-reflecting films each of which is composed of, for instance, a stack of indium tin oxide (ITO), IZO, Ca or Mg, and of Al or Ag or of Ag-containing alloy, and the common electrode 25 is a light-transparent film composed of, for instance, a metal thin film of ITO, IZO, Ag, magnesium-silver alloy or other materials, or composed of, for instance, a silver nanowire. It is noted that the top-emission type is non-limiting; a bottom-emission type may be used.

In FIG. 1 and FIG. 2, the first pixel electrode K1 is an anode connected to an ELVDD power source (high-potential power source) via the first transistor T1, the second pixel electrode K2 is an anode connected to an ELVDD power source via the second transistor T2, the third pixel electrode K3 is an anode connected to an ELVDD power source via the third transistor T3, the common electrode 25 is a common cathode connected to ELVSS power sources (low-potential power sources), the lower charge function layer UL is a hole transport layer, and the upper charge function layer FL is an electron transport layer. However, the foregoing is non-limiting; some embodiments provide a configuration where the first to third pixel electrodes K1 to K3 are cathodes, where the common electrode 25 is an anode, where the lower charge function layer UL is an electron transport layer, and where the upper charge function layer FL is a hole transport layer. At least one of the lower charge function layer UL and upper charge function layer FL may include a charge injection layer and a charge transport layer as well as a charge blocking layer.

The substrate 4 includes a base 2, a semiconductor film SC, a gate insulating film 16, a gate electrode GE, a first inorganic insulating film 18, and a second inorganic insulating film 20. Each of the first to third transistors T1 to T3 includes the gate electrode GE and the semiconductor film SC, which functions as a channel. The base 2 is made of, but not limited to, glass or flexible resin. The uppermost layer of the base 2 may be composed of a barrier layer (e.g., an inorganic insulating film of silicon nitride or other materials) that blocks foreign substances, such as water and oxygen. The semiconductor film SC is composed of, but not limited to, low-temperature polysilicon (LTPS) or an oxide semiconductor. Low-temperature polysilicon (LTPS), oxide semiconductors and other materials, when processed into conductors, can function as a wire and an electrode as well as the source region and drain region of each transistor.

The light-emitting elements X1 to X3 are quantum-dot light-emitting diodes (QLEDs) at least one of which for instance, includes quantum dots as a light-emitting material in the light-emitting layer. The first light-emitting layer E1 is a resist layer for instance that is formed through application and photolithography, and the first light-emitting layer E1 includes first quantum dots that emit a first color. Further, the resist layer includes a photoresist for instance; for a positive photoresist, the resist layer contains, but not limited to, a mixture of novolak resin and photosensitive material, or acrylic resin that falls under a chemical amplification type, and for a negative photoresist, the resist layer contains, but not limited to, acrylic resin. The second light-emitting layer E2 is an ink-jet printed layer for instance that is formed through ink-jet printing, and the second light-emitting layer E2 includes, as an ink-jet printing material, second quantum dots that emit a second color. The ink-jet printing material is a material that is contained in an ink to be ejected; the ink-jet printed layer may contain an ink-jet printing material other than the second quantum dots, for instance, a viscosity controlling agent. Carbon nano-fibers for instance are used for the viscosity controlling agent. The third light-emitting layer E3 is a resist layer for instance that is formed through application and photolithography, and the third light-emitting layer E3 includes third quantum dots that emit a third color.

The first light-emitting layer E1 overlaps the semiconductor film SC of at least one of the first transistor T1 and second transistor T2 in plan view. The first light-emitting layer E1 in FIG. 2, under which the insulating film 21 is disposed, overlaps the semiconductor film SC of the first transistor T1 and the semiconductor film SC of the second transistor T2 in plan view. In contrast, the second light-emitting layer E2, under which the insulating film 21 is not disposed, does not overlap the semiconductor film SC of the second transistor T2 in plan view.

In the light-emitting elements X1 to X3, a driving current that occurs between the first to third pixel electrodes K1 to K3 and the common electrode 25 causes positive holes (holes) and electrons to recombine within the first to third light-emitting layers E1 to E3, thus generating excitons, and the excitons emit light in the process of transition from a conduction band level of the quantum dots to a valence band level of the same.

The display device 10 according to the first embodiment includes the first pixel electrode K1 formed on the upper surface 21*j* of the insulating film 21 and includes the first light-emitting layer E1 formed over the first pixel electrode K1 and overlapping the first pixel electrode K1 in plan view. In this way, providing the first light-emitting layer E1 on the insulating film 21 and providing the second light-emitting layer E2 in the recess 21*y*, a bank, of the insulating film 21 can increase the aperture ratio of the display unit 30 further than the foregoing known configuration, where the individual light emission regions of the three colors are placed between the banks. Further, establishing the second light-emitting layer E2 as an ink-jet printed layer that is formed through ink-jet printing using the insulating film 21 as a bank and using the side surface of the insulating film 21 as a liquid stopper can eliminate an evaporation process step or photolithography process step for forming the second light-emitting layer E2, thus enabling the manufacturing process steps to be simplified. The ink-jet printed layer, which contains no resist, does not hinder charge flow, thus offering an advantage in which light emission efficiency enhances.

Further, the second light-emitting layer E2, formed in the recess 21y of the insulating film, does not overlap the semiconductor film SC of the second transistor T2 in plan view. This configuration enables the lower charge function layer UL and second light-emitting layer E2 to be formed flat, thus enhancing the light emission efficiency.

A typical light-emitting element (QLED) that emits blue light has poorer light emission efficiency than a light-emitting element that emits red light or green light. Accordingly, the first color, which is the color of light emitted by the first light-emitting layer (resist layer), is desirably red or green, and the second color, which is the color of light emitted by the second light-emitting layer (ink-jet printed layer), is desirably blue.

Figure 3:
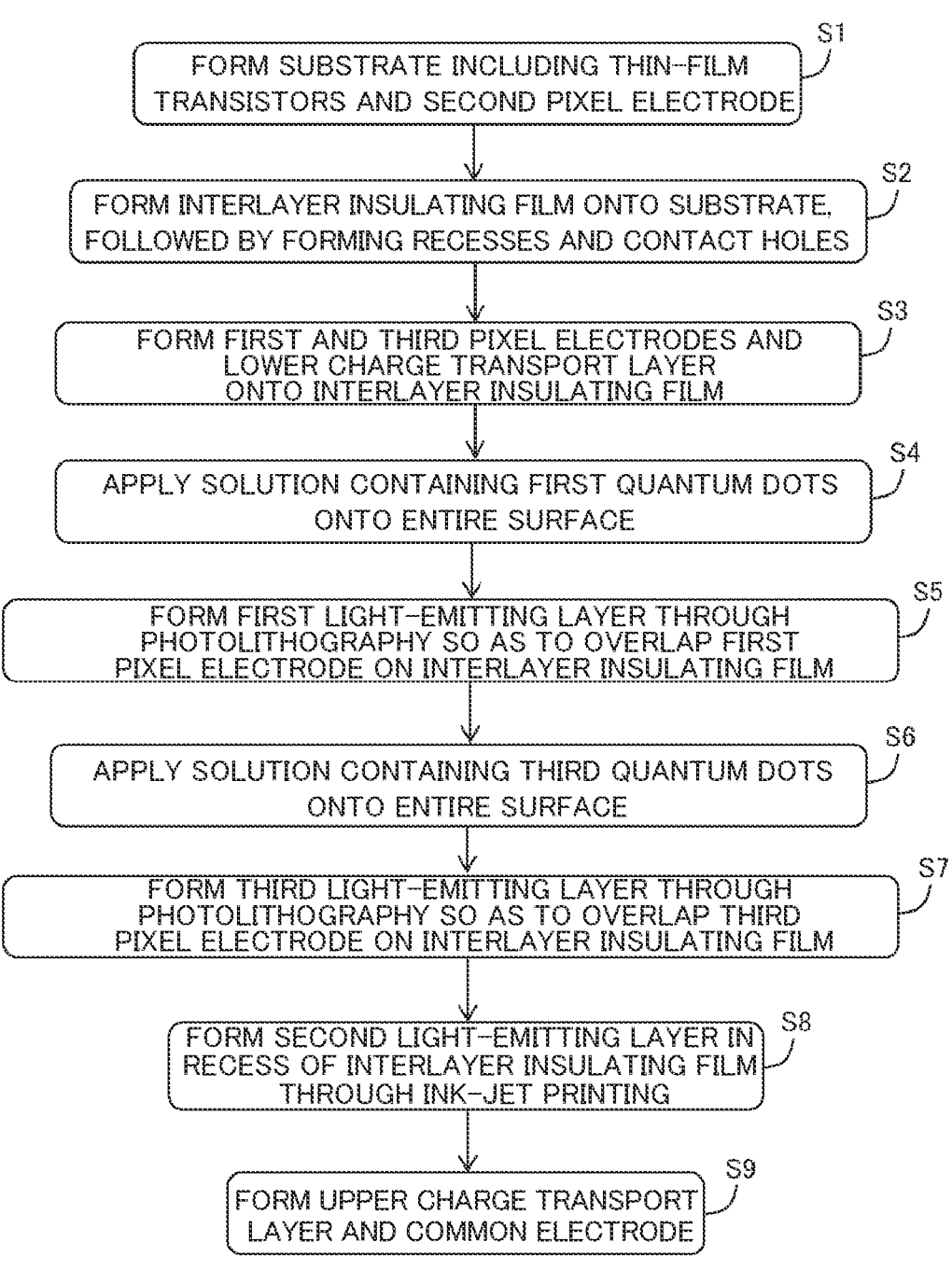
FIG. 3 is a flowchart showing an example method for manufacturing the display device.
Figure 4:
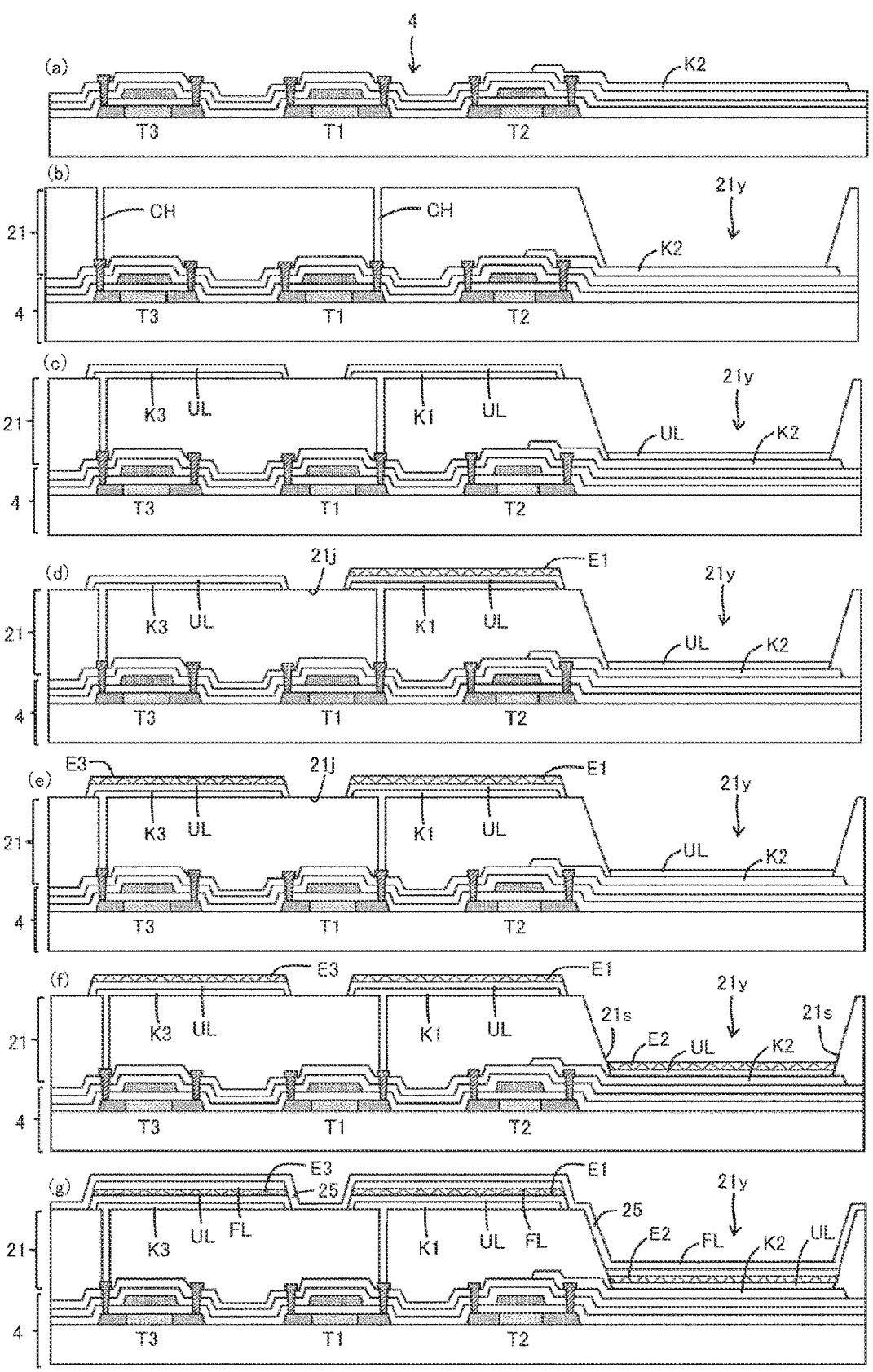
FIG. 4(*a*) to FIG. 4(*g*) illustrate, in sectional view, the method for manufacturing the display device according to the first embodiment.

FIG. 3 is a flowchart showing an example method for manufacturing the display device. FIG. 4(a) to FIG. 4(g) illustrate, in sectional view, the method for manufacturing the display device according to the first embodiment. Step S1 is forming the substrate 4 including the first to third transistors T1 to T3. The second pixel electrode K2 is formed onto the uppermost layer at this time, as illustrated in FIG. 4(a).

Step S2 is forming the insulating film 21 onto the substrate, followed by forming the recesses 21y and the contact holes CH, as illustrated in FIG. 4(b). The thickness of the insulating film 21 is set at 1 to 2 μm for instance.

Step S3 is forming the first pixel electrode K1, third pixel electrode K3, and the lower charge function layer UL sequentially onto the insulating film 21 through sputtering, evaporation or other methods, as illustrated in FIG. 4(c).

Step S4 is applying a solution containing first quantum dots and a resist onto the entire surface. Step S5 is forming the first light-emitting layer E1 through photolithography so as to overlap the first pixel electrode K1 on the insulating film 21 in plan view, as illustrated in FIG. 4(d). To be specific, the solution applied on the entire surface undergoes pre-baking at 50 to 120° C. to vaporize the solvent, the dried coated film next undergoes exposure using a mask (the exposure intensity is 1000 mJ/cm² for instance), followed by development using an alkaline solution, an organic solvent, water and other things, followed by substantial baking, as necessary, at 70 to 200° C. An epoxy or acrylic material can be used as the resist.

Step S6 is applying a solution containing third quantum dots and a resist onto the entire surface, and Step S7 is forming the third light-emitting layer E3 through photolithography so as to overlap the third pixel electrode K3 on the insulating film 21 in plan view, as illustrated in FIG. 4(e). In Step S7, the third light-emitting layer E3 is formed through a process step similar to Step S5.

Step S8 is forming the second light-emitting layer E2 in the recess 21y of the insulating film through ink-jet printing so as to overlap the second pixel electrode K2 in plan view. Herein, ink containing the third quantum dots and a solvent that disperses them is ejected into a space defined by a side surface 21s (liquid stopper) of the insulating film, and the solvent is removed through baking, vacuum, reduced-pressure drying or other methods, as illustrated in FIG. 4(f). A liquid including at least one of, for instance, isopropyl alcohol, ethanol, glycol ether, octane, toluene, methanol, butanol, hexane, acetonitrile and water can be used as the solvent.

Step S9 is forming the upper charge function layer FL and the common electrode 25 sequentially onto the first to third light-emitting layers E1 to E3 through sputtering, evaporation or other methods, as illustrated in FIG. 4(g).

The individual light-emitting layers (E1, E2, and E3) are 1 to 100 nm thick, and the activation layers (the lower charge function layer, light-emitting layers, and upper charge function layer) are 10 to 200 nm thick. Color-coding of the lower charge function layer UL and color-coding of the upper charge function layer FL are possible as well by mixing nanoparticles having the action of charge functioning and a resist together, followed by exposure and development.

Examples of the lower charge function layer UL, having a hole transport function, include the following: benzene, styrylamine, triphenylamine, porphyrin, triazole, imidazole, oxadiazole, polyallylalkane, phenylenediamine, allylamine, oxazole, anthracene, fluorenone, hydrazone, stilbene, triphenylene, azatriphenylene, and derivatives thereof; organic chain-conjugated monomers, oligomers or polymers, such as a polysilane compound, a vinylcarbazole compound, a thiophene compound, and an aniline compound; and inorganic compounds of nickel oxide, tungsten oxide, titanium oxide, and cesium oxide, all of which can constitute a film that can be formed from a solution.

Examples of the materials of the first to third quantum dots include CdSe, CdZnSe, InP, ZnSe, ZnS, ZnTe, ZnTeSe, Si, and CdS.

Examples of the material of the upper charge function layer FL, having an electron transport function, include organic compounds of Alq, $Alq_3$, BCP and other materials, and inorganic compounds (may be in the form of nanoparticles) of ZnO (Al, Mg, Li, Ga and other things may be added thereto), $SnO_2$, $In_2O_3$ and other materials.

Second Embodiment

Figure 5:
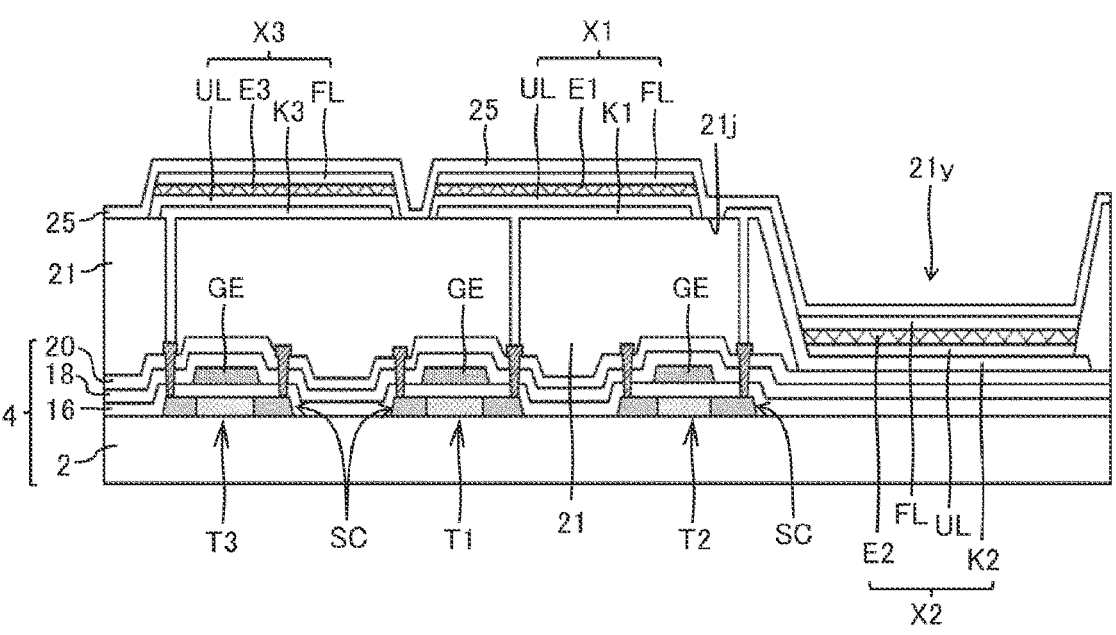
FIG. 5 is a sectional view of the configuration of a display unit according to a second embodiment.

FIG. 5 is a sectional view of the configuration of a display unit according to a second embodiment. The second pixel electrode K2 in FIG. 5 is formed over the insulating film 21 and in the same layer as the first pixel electrode K1 and third pixel electrode K3. This can reduce the number of manufacturing process steps.

Figure 6:
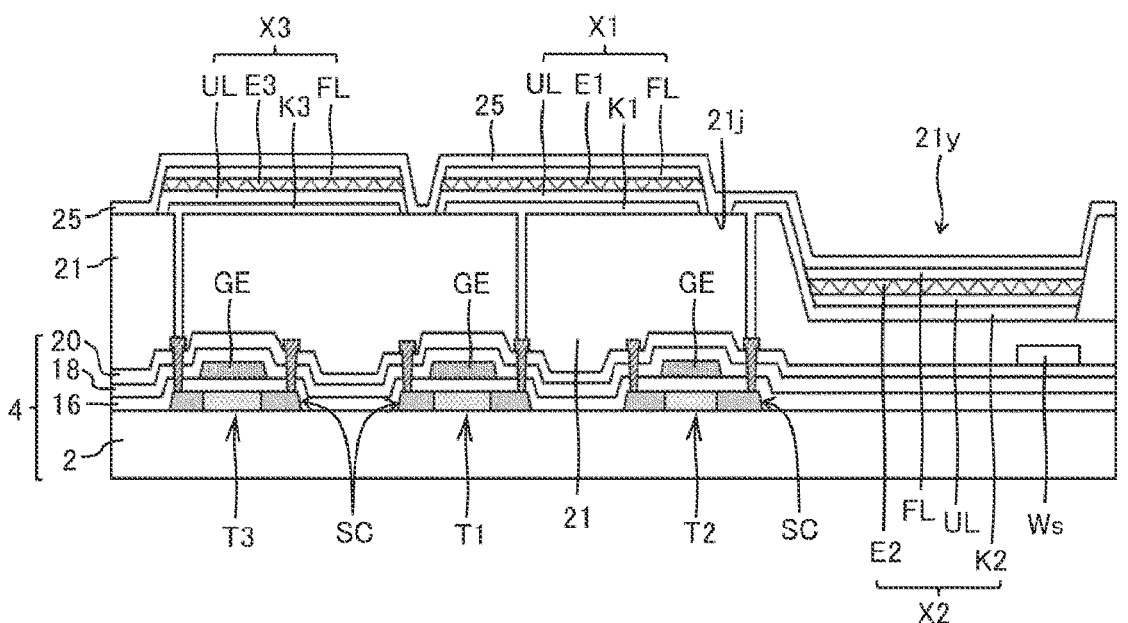
FIG. 6 is a sectional view of a modification of the display unit according to the second embodiment.

FIG. 6 is a sectional view of a modification of the display unit according to the second embodiment. Although the insulating film 21 is removed in the recess 21y of the insulating film in FIG. 5, this is non-limiting. A configuration may be provided where the insulating film 21 in the recess 21y is formed more thinly than its surrounding region, as illustrated in FIG. 6. This configuration enables the second light-emitting layer E2 to be formed flat even when the second light-emitting layer E2 overlaps a wire Ws and other components. The foregoing recess 21y of the insulating film can be formed through photolithography using a grayscale mask.

Third Embodiment

Figure 7:
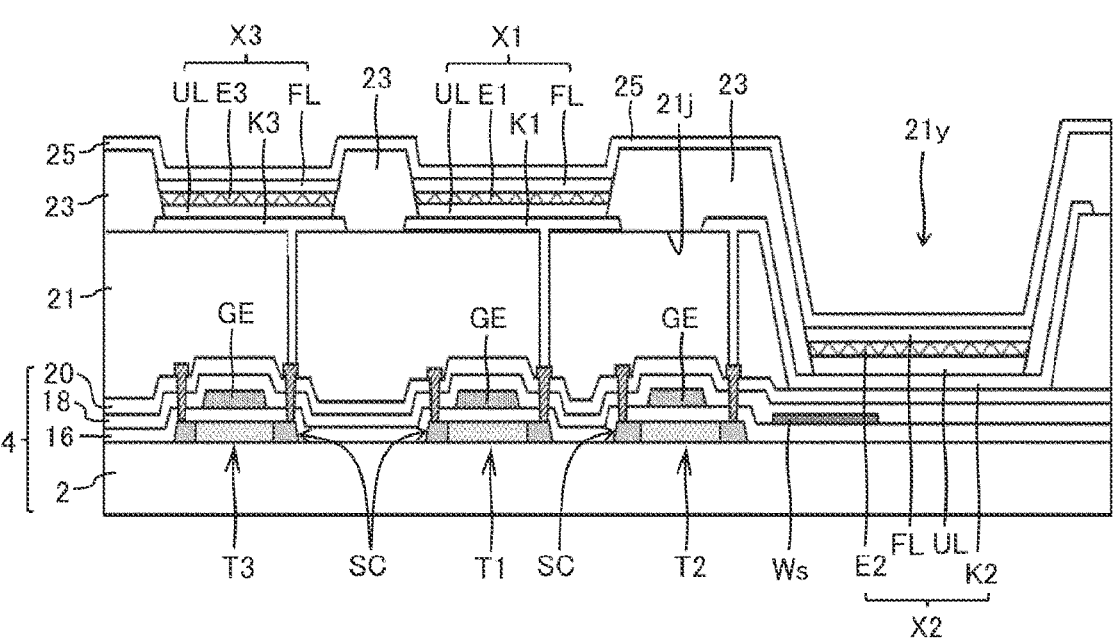
FIG. 7 is a sectional view of the configuration of a display unit according to a third embodiment.

FIG. 7 is a sectional view of the configuration of a display unit according to a third embodiment. In FIG. 7, the second pixel electrode K2 is formed over the insulating film 21 and in the same layer as the first pixel electrode K1 and third pixel electrode K3, and an edge cover film 23 covering the edges of the first to third pixel electrodes K1 to K3 is provided over the insulating film 21. The first light-emitting layer E1 and the third light-emitting layer E3 in this case are formed in openings of the edge cover film 23. Doing so can prevent electric fields near the edges of the first to third pixel electrodes K1 to K3 and can further raise a liquid stopper that is used in forming the second light-emitting layer E2 through ink-jet printing. It is noted that the second light-emitting layer E2 does not overlap the semiconductor film SC of the second transistor T2 in plan view, but may overlap the wire Ws in plan view.

Figure 8:
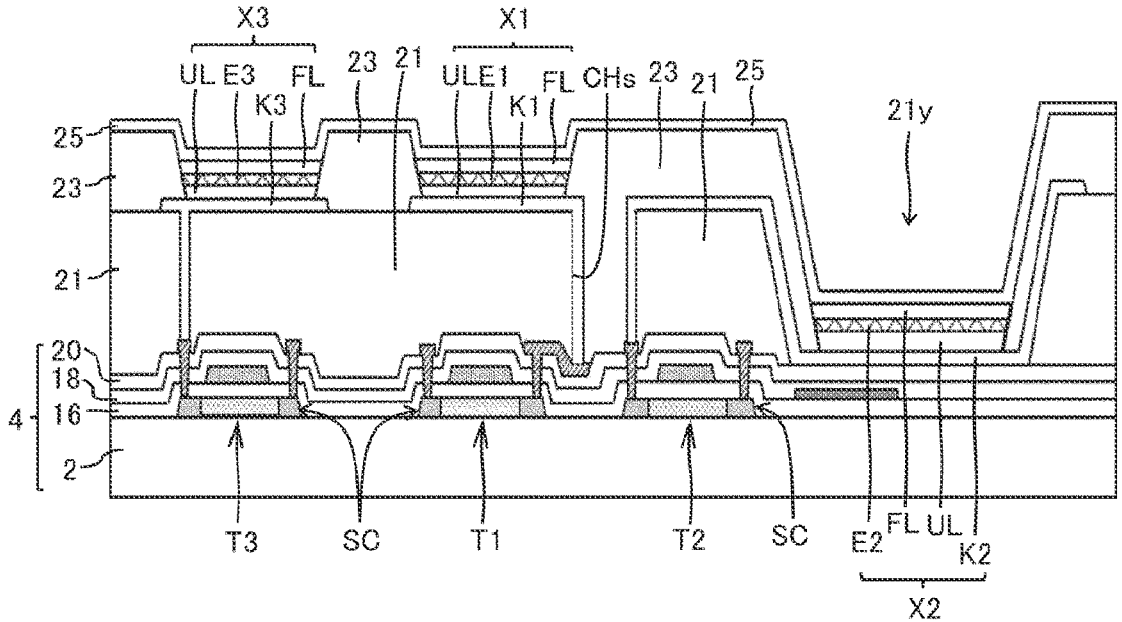
FIG. 8 is a sectional view of a modification of the display unit according to the third embodiment.

FIG. 8 is a sectional view of a modification of the display unit according to the third embodiment. In FIG. 8, the first transistor T1 is connected to the first pixel electrode K1 via a common contact hole CHs that is formed in the insulating film 21, and the second transistor T2 is connected to the second pixel electrode K2 via the common contact hole CHs. The first pixel electrode K1 and the second pixel electrode K2 are separated within the common contact hole CHs by the edge cover film 23.

Fourth Embodiment

FIG. 9(a) is a plan view of the configuration of a display unit according to a fourth embodiment, and FIG. 9(b) is a sectional view of the configuration of the display unit according to the fourth embodiment. FIG. 9 illustrates the insulating film 21 provided with the recess 21y and another recess 21z.

The light-emitting element X1 includes the following: the first pixel electrode K1 formed on the upper surface 21j of the insulating film 21; and the first light-emitting layer E1 formed over the first pixel electrode K1 and overlapping the first pixel electrode K1 in plan view. The first pixel electrode K1 is connected to the first transistor T1 via the contact hole CH.

The light-emitting element X2 includes the following: the second pixel electrode K2 formed under the insulating film 21; and the second light-emitting layer E2 formed in the recess 21y of the insulating film 21 and overlapping the second pixel electrode K2 in plan view. The insulating film 21 covers the edge of the second pixel electrode K2, and the second pixel electrode K2 is connected to the second transistor T2.

The light-emitting element X3 includes the following: the third pixel electrode K3 formed under the insulating film 21; and the third light-emitting layer E3 formed in the recess 21z of the insulating film 21 and overlapping the third pixel electrode K3 in plan view. The insulating film 21 covers the edge of the third pixel electrode K3, and the third pixel electrode K3 is connected to the third transistor T3.

The first light-emitting layer E1 is a resist layer that is formed through application and photolithography, and the first light-emitting layer E1 includes first quantum dots that emit a first color. The second light-emitting layer E2 is an ink-jet printed layer that is formed through ink-jet printing, and the second light-emitting layer E2 includes second quantum dots that emit a second color. The third light-emitting layer E3 is an ink-jet printed layer that is formed through ink-jet printing, and the third light-emitting layer E3 includes third quantum dots that emit a third color.

The first light-emitting layer E1, under which the insulating film 21 is disposed, overlaps the semiconductor film SC of the first transistor T1, the semiconductor film SC of the second transistor T2, and the semiconductor film SC of the third transistor T3 in plan view. The second light-emitting layer E2, under which the insulating film 21 is not disposed, does not overlap the semiconductor film SC of the second transistor T2 in plan view. Further, the third light-emitting layer E3, under which the insulating film 21 is not disposed, does not overlap the semiconductor film SC of the third transistor T3 in plan view.

FIG. 9 illustrates, by way of example, that the area of the second light-emitting layer E2>the area of the third light-emitting layer E3>the area of the first light-emitting layer E1 is established, that the first color, which is the color of light emitted by the first light-emitting layer (resist layer), is green, that the second color, which is the color of light emitted by the second light-emitting layer (ink-jet printed layer), is blue, and that the third color, which is the color of light emitted by the third light-emitting layer (ink-jet printed layer), is red.

The fourth embodiment, which enables the second and third light-emitting layers E2 and E3 to be formed through ink-jet printing, can reduce the number of manufacturing process steps.

FIG. 10 is a sectional view of a modification of the display unit according to the fourth embodiment. The first transistor T1 may be disposed under an insulating film 21a located on one side of the recess 21z, and the third transistor T3 may be disposed under an insulating film 21b located on the other side of the same, as illustrated in FIG. 10.

First to Fourth Embodiments

FIG. 11(a) to FIG. 11(d) are plan views of example pixel configurations in the respective embodiments. FIG. 11(a) illustrates four pixels PX1 to PX4 arranged in two rows and two columns, in each of which the subpixel SP3 of red including the third light-emitting layer E3 that is liner, the subpixel SP1 of green including the first light-emitting layer E1 that is linear, and the subpixel SP2 of blue including the second light-emitting layer E2 that is linear are arranged in this order in the row direction to thus constitute a striped shape. Herein, the width of the second light-emitting layer E2>the width of the third light-emitting layer E3>the width of the first light-emitting layer E1 is established for instance. Doing so can render the ink-jet printed layer (E2, or E2 and E3) common throughout a plurality of subpixels of the same color arranged in the column direction.

FIG. 11(b) illustrates four pixels PX1 to PX4 arranged in two rows and two columns, among which PX1 and PX3, adjacent to each other in the column direction, each include the subpixel SP3 of red (including the third light-emitting layer E3), the subpixel SP1 of green (including the first light-emitting layer E1) and the subpixel SP2 of blue (including the second light-emitting layer E2) arranged in this order in the row direction to thus constitute a striped shape, and among which PX2 and PX4, adjacent to each other in the column direction, each include the subpixel SP2 of blue (including the second light-emitting layer E2), the subpixel SP1 of green (including the first light-emitting layer E1) and the subpixel SP3 of red (including the third light-emitting layer E3) arranged in this order in the row direction to thus constitute a striped shape. Doing so can render the ink-jet printed layer (E2, or E2 and E3) common throughout a plurality of subpixels of the same color arranged in the column direction and can further render the ink-jet printed layer (E2) common between two subpixels of the same color adjacent to each other in the row direction.

FIG. 11(c) illustrates four pixels PX1 to PX4 arranged in two rows and two columns, each of which is divided into the first subpixel SP1 (e.g., a trapezoid), the second subpixel SP2 (e.g., a square) and the third subpixel SP3 (e.g., a trapezoid), which are disposed in such a manner that the first subpixel SP1 is adjacent to the second and third subpixels SP2 and SP3, that the second subpixel SP2 is adjacent to the first and third subpixels SP1 and SP3, and that the third subpixel SP3 is adjacent to the first and second subpixels SP1 and SP2. Furthermore, the subpixels are configured in such a manner that the second subpixels SP2 of the pixels PX1 and PX3, adjacent to each other in the column direction, are adjacent to each other, that the second subpixels SP2 of the pixels PX1 and PX2, adjacent to each other in the row direction, are adjacent to each other, that the second subpixels SP2 of the pixels PX2 and PX4, adjacent to each other in the column direction, are adjacent to each other, that the second subpixels SP2 of the PX3 and PX4, adjacent to each other in the row direction, are adjacent to each other, that the first subpixels SP1 of the pixels PX1 and PX3 are adjacent to each other, that the third subpixels SP3 of the pixels PX1 and PX2 are adjacent to each other, that the first subpixels SP1 of the pixels PX2 and PX4 are adjacent to each other, and that the third subpixels SP3 of the pixels PX3 and PX4 are adjacent to each other. Doing so can render the ink-jet printed layer (E2, or E2 and E3) common throughout four subpixels of the same color.

FIG. 11(d) illustrates four pixels PX1 to PX4 arranged in two rows and two columns, each of which is divided into the first subpixel SP1 (e.g., a trapezoid), the second subpixel SP2 (e.g., a square) and the third subpixel SP3 (e.g., a trapezoid), which are disposed in such a manner that the first subpixel SP1 is adjacent to the second and third subpixels SP2 and SP3, that the second subpixel SP2 is adjacent to the first and third subpixels SP1 and SP3, and that the third subpixel SP3 is adjacent to the first and second subpixels SP1 and SP2. Furthermore, two of the pixels adjacent to each other in the column direction or row direction is configured in such a manner that the first and third subpixels SP1 and SP3 are adjacent to each other. Doing so can render the ink-jet printed layer (E2) common throughout four subpixels of the same color.

Fifth Embodiment

The first light-emitting layer E1 and other components in FIG. 2 and FIG. 5 through FIG. 10 may be formed through a liftoff method. FIG. 12 is a flowchart showing an example method for manufacturing a display device. FIG. 13 illustrates, in sectional view, the method for manufacturing the display device illustrated in FIG. 12. Steps S1 through S3 are performed in a manner similar to those in FIG. 3. The lower charge function layer UL may undergo color-coding or may undergo entire-surface application. The lower charge function layer UL may be formed through evaporation or ink-jet printing.

Step S4a is, as illustrated in FIG. 13(a) through (c), forming a sacrificial layer SL through photolithography, followed by entire-surface application of a solution containing first quantum dots (that emits red light), and by solvent removal (drying) to form a coated film Ef. The sacrificial layer SL can be formed through, for instance, a photoresist application step, an exposure step and a development step.

Step S5a is removing the sacrificial layer SL and an unnecessary portion (portion located above the sacrificial layer SL and including an upper portion Ej of the recess 21y) of the coated film Ef using a remover liquid to thus form the first light-emitting layer E1, as illustrated in FIG. 13(d), (a liftoff method). At this time, a residue Sz of the sacrificial layer SL may be included under the first light-emitting layer E1.

Step S6a is forming a sacrificial layer through photolithography, followed by entire-surface application of a solution containing third quantum dots (that emits green light), and by solvent removal (drying) to form a coated film. Step S7a is removing the sacrificial layer and an unnecessary portion (portion located in the sacrificial layer) of the coated film using a remover liquid to thus form the third light-emitting layer E3 (a liftoff method). Steps S8 through S9 are performed in a manner similar to those in FIG. 3. Although the foregoing has described an instance where the third light-emitting layer E3 is formed through a liftoff method, a method may be used where the third light-emitting layer E3 is formed as a resist layer (in a manner similar to Step S7 in FIG. 3).

The first light-emitting layer E1 can be formed through another method. For instance, the first light-emitting layer can be formed in a predetermined region by patterning a sacrificial layer having surface liquid-repellency, and by forming, in a portion having no sacrificial layer (a predetermined region that is not liquid repellent), a coated film including the first quantum dots, followed by removing the sacrificial layer.

The sacrificial layer having surface liquid-repellency can be formed by, for instance, applying a solution containing a photoresist, a liquid-repellent ingredient (e.g., perfluoroalkyl substances) and a solvent, followed by baking and other processing. The liquid-repellent ingredient moves to the surface and thus becomes dense on the sacrificial layer surface before the sacrificial layer solidifies, thus increasing the liquid repellency of the sacrificial layer surface. Accordingly, applying a solution containing the first quantum dots onto the enter surface for instance forms, in a portion having no sacrificial layer (a predetermined region that is not liquid repellent), a coated film including the first quantum dots. In so doing, the coated film may be formed through a method other than entire-surface application. Subpixel-by-subpixel application through ink-jet printing or other methods may be used for instance.

It is noted that applying a liquid that provides liquid repellency onto the sacrificial layer after forming the sacrificial layer can form the sacrificial layer having surface liquid-repellency. When the sacrificial layer is formed of a photoresist for instance, applying a liquid-repellent material that bonds to the OH group of the photoresist onto the photoresist, and other processes enables the sacrificial layer surface to have liquid repellency. Further, when a charge transport layer (e.g., a hole transport layer) is formed under the first light-emitting layer E1 and when this charge transport layer does not include an OH group, forming a charge transport layer undergone patterning, followed by applying a liquid-repellent material entirely can provide the photoresist with liquid repellency selectively. In removing a photosensitive sacrificial layer, the sacrificial layer may be immersed in a remover liquid to be removed, or the sacrificial layer may be exposed to light selectively (a coated film including the first quantum dots does not undergo exposure using a mask or other things) and may be then removed.

The first light-emitting layer E1 can be formed through further another method. For instance, the first light-emitting layer can be formed in a predetermined region by subjecting a coated film including the first quantum dots with photosensitive ligands coordinating therewith to selective exposure using a mask or other things, by then bonding the ligands in the exposed region (predetermined region) together, and by then removing the unexposed regions. The photosensitive ligands may be, for instance, organic compounds having C—H bonding or may be, for instance, inorganic compounds having Sn—S bonding. The first light-emitting layer E1 of the display device includes the first quantum dots and the photosensitive ligands when the foregoing method is used.

In forming the lower charge function layer UL or upper charge function layer FL for each subpixel individually, a method (e.g., a liftoff method) similar to that in the first light-emitting layer E1 can be used.

Sixth Embodiment

FIG. 14 is a sectional view of the configuration of a display unit according to a sixth embodiment. The display unit in FIG. 14 includes the following: the substrate 4; the insulating film 21 formed over the substrate 4; the first pixel electrode K1 formed over the insulating film 21; the first light-emitting layer E1 formed over the first pixel electrode K1 and overlapping the first pixel electrode K1 in plan view; and the second light-emitting layer E2 formed in the recess 21y provided in the insulating film 21.

The substrate 4 includes the first transistor T1 and the second transistor T2. The first light-emitting layer E1 overlaps the semiconductor film SC of at least one of the first transistor T1 and second transistor T2 in plan view. To be specific, the first light-emitting layer E1 overlaps the semiconductor films SC of the respective first transistor T1 and second transistor T2 in plan view. The second light-emitting layer E2 does not overlap the semiconductor film SC of the second transistor T2 in plan view.

The first light-emitting layer E1 includes first quantum dots that emit a first color (e.g., red), and the second light-emitting layer includes second quantum dots that emit a second color (e.g., blue) different from the first color. The insulating film 21 is an interlayer insulating film and also a flattening film formed on the substrate 4. The insulating film 21 is removed in the recess 21y. The second light-emitting layer E2 is an ink-jet printed layer containing an ink-jet printing material. The second light-emitting layer E2 may be provided in common in a plurality of subpixels of the same color.

The insulating film 21 has a recess 21x different from the recess 21y, and the first light-emitting layer E1 is formed in the recess 21x. The first light-emitting layer E1 may be an ink-jet printed layer. The insulating film 21 in the recess 21x is formed more thinly than its surrounding region, and the recess 21x is shallower than the recess 21y.

The display unit in FIG. 14 includes the third light-emitting layer E3 including third quantum dots that emit a third color (e.g., green) different from the first color and second color. The third light-emitting layer E3 can be formed through, but not limited to, a liftoff method (see Steps S6a through S7a in FIG. 12). The third light-emitting layer E3 may serve as a resist layer.

The first light-emitting layer E1 and the second light-emitting layer E2 may be linear in plan view, and the second light-emitting layer E2 may be wider than the first light-emitting layer E1.

Seventh Embodiment

FIG. 15 is a sectional view of the configuration of a display unit according to a seventh embodiment. The display unit in FIG. 15 includes the following: the substrate 4; the insulating film 21 formed over the substrate 4; the first pixel electrode K1 formed over the insulating film 21; the first light-emitting layer E1 formed over the first pixel electrode K1 and overlapping the first pixel electrode K1 in plan view; and the second light-emitting layer E2 formed in the recess 21y provided in the insulating film 21.

The insulating film 21 is an interlayer insulating film and also a flattening film. The insulating film 21 covers an edge KE of the second pixel electrode K2. The first light-emitting layer E1 does not have to overlap the semiconductor films SC of the respective first transistor T1 and second transistor T2 in plan view, as illustrated in FIG. 15.

Eighth Embodiment

FIG. 16 is a sectional view of the configuration of a display unit according to an eighth embodiment. The display unit in FIG. 16 includes the following: the substrate 4; the insulating film 21 formed over the substrate 4; the first pixel electrode K1 formed over the insulating film 21; the first light-emitting layer E1 formed over the first pixel electrode K1 and overlapping the first pixel electrode K1 in plan view; the second light-emitting layer E2 formed in the recess 21y provided in the insulating film 21; and the edge cover film 23 covering the edge of the first pixel electrode K1 and the edge of the second pixel electrode K2. The edge cover film 23 covers the edge of the third pixel electrode K3 as well.

The first light-emitting layer E1 does not have to overlap the semiconductor films SC of the respective first transistor T1 and second transistor T2 in plan view, as illustrated in FIG. 16.

Ninth Embodiment

FIG. 17 is a sectional view of the configuration of a display unit according to a ninth embodiment. The display unit in FIG. 17 includes the following: the substrate 4; the insulating film 21 formed over the substrate 4; the first pixel electrode K1 formed over the insulating film 21; the first light-emitting layer E1 formed over the first pixel electrode K1 and overlapping the first pixel electrode K1 in plan view; the second light-emitting layer E2 formed in the recess 21y provided in the insulating film 21; and the third light-emitting layer E3 formed in the same layer as the first light-emitting layer E1 and configured to emit a color different from a color that is emitted by the first light-emitting layer E1. The first light-emitting layer E1 includes first quantum dots that emit a first color. The second light-emitting layer E2 is an ink-jet printed layer including second quantum dots that emit a second color. The third light-emitting layer E3 includes third quantum dots that emit a third color.

The first light-emitting layer E1 does not have to overlap the semiconductor films SC of the respective first transistor T1 and second transistor T2 in plan view, as illustrated in FIG. 17. As a matter of course, the first light-emitting layer E1 may overlap the semiconductor film SC of at least one of the first transistor T1 and second transistor T2 in plan view (see FIG. 2).

The insulating film 21 does not have to cover the edge of the second pixel electrode K2, as illustrated in FIG. 17. As a matter of course, the insulating film 21 may cover the edge of the second pixel electrode K2 (see FIG. 2).

The first light-emitting layer E1 and the third light-emitting layer E3 are located in the same layer and at the same height (the same distance from the base 2). The first light-emitting layer E1 and the third light-emitting layer E3 can be formed through, but not limited to, a liftoff method. The first light-emitting layer E1 and the third light-emitting layer E3, located in the same layer, may serve as resist layers (see FIG. 2).

Further, when the edge cover film 23 is formed over the insulating film 21, the first light-emitting layer E1 and the third light-emitting layer E3, located in the same layer, may serve as ink-jet printed layers formed in recesses of the edge cover film 23 (see FIG. 7, FIG. 8, and FIG. 15).

The foregoing individual embodiments aim at illustration and description and do not aim at limitation. One having ordinary skill in the art would clearly understand that numerous modifications can be devised based on the foregoing illustration and description.

The invention claimed is:

1. A display device comprising:
a substrate;
an insulating film formed over the substrate;
a first pixel electrode formed over the insulating film;
a first light-emitting layer formed over the first pixel electrode and overlapping the first pixel electrode in a plan view;
a second light-emitting layer formed in a recess provided in the insulating film;
a second pixel electrode overlapping the recess in the plan view;
a third pixel electrode formed over the insulating film or in another recess provided in the insulating film; and
a third light-emitting layer formed over the third pixel electrode, overlapping the third pixel electrode in the plan view, and configured to emit a color different from colors emitted by the first light-emitting layer and the second light-emitting layer,
wherein:
at least one of the first light-emitting layer or the second light-emitting layer includes a quantum dot as a light-emitting material, and
at least one of the first light-emitting layer or the third light-emitting layer is a resist layer.

2. The display device according to claim 1, wherein the insulating film covers an edge of the second pixel electrode.

3. A display device comprising:
a substrate;
an insulating film formed over the substrate;
a first pixel electrode formed over the insulating film;
a first light-emitting layer formed over the first pixel electrode and overlapping the first pixel electrode in a plan view;
a second light-emitting layer formed in a recess provided in the insulating film; and
a second pixel electrode overlapping the recess in the plan view,
wherein:
at least one of the first light-emitting layer or the second light-emitting layer includes a quantum dot as a light-emitting material, and
a residue of a sacrificial layer for liftoff is included under a part of the first light-emitting layer.

4. The display device according to claim 3, wherein the second light-emitting layer is provided in common to a plurality of subpixels of an identical color.

5. The display device according to claim 3, wherein
the first light-emitting layer and the second light-emitting layer are linear in the plan view, and
the second light-emitting layer is wider than the first light-emitting layer.

6. The display device according to claim 3, wherein
the substrate includes a first transistor connected to the first pixel electrode, and a second transistor connected to the second pixel electrode, and the first light-emitting layer further overlaps a semiconductor film of at least one of the first transistor or the second transistor in the plan view.

7. The display device according to claim 3, wherein the insulating film covers an edge of the second pixel electrode.

8. The display device according to claim 3, further comprising an edge cover film covering an edge of the first pixel electrode.

9. The display device according to claim 3, wherein the insulating film is removed in the recess.

10. The display device according to claim 3, wherein the insulating film is formed more thinly in the recess than in a surrounding region of the insulating film.

11. The display device according to claim 3, wherein the second light-emitting layer further comprises an ink-jet printed layer containing an ink-jet printing material.

12. A display device comprising:
a substrate;
an insulating film formed over the substrate;
a first pixel electrode formed over the insulating film;
a first light-emitting layer formed over the first pixel electrode and overlapping the first pixel electrode in a plan view;
a second light-emitting layer formed in a recess provided in the insulating film; and
a second pixel electrode overlapping the recess in the plan view,
wherein:
at least one of the first light-emitting layer or the second light-emitting layer includes a quantum dot as a light-emitting material, and
the first light-emitting layer includes the quantum dot and a photosensitive ligand.

13. The display device according to claim 12, wherein
the substrate includes a first transistor connected to the first pixel electrode, and a second transistor connected to the second pixel electrode, and
the first light-emitting layer further overlaps a semiconductor film of at least one of the first transistor or the second transistor in the plan view.

14. The display device according to claim 12, wherein the insulating film covers an edge of the second pixel electrode.

15. The display device according to claim 12, further comprising an edge cover film covering an edge of the first pixel electrode.

16. The display device according to claim 12, wherein the insulating film is removed in the recess.

17. The display device according to claim 12, wherein the insulating film is formed more thinly in the recess than in a surrounding region of the insulating film.

18. The display device according to claim 12, wherein the second light-emitting layer further comprises an ink-jet printed layer containing an ink-jet printing material.

19. The display device according to claim 12, wherein the second light-emitting layer is provided in common in a plurality of subpixels of an identical color.

20. The display device according to claim 12, wherein
the first light-emitting layer and the second light-emitting layer are linear in the plan view, and
the second light-emitting layer is wider than the first light-emitting layer.

* * * * *